United States Patent
Im et al.

(10) Patent No.: US 12,230,606 B2
(45) Date of Patent: Feb. 18, 2025

(54) SEMICONDUCTOR PACKAGE AND RELATED METHODS

(71) Applicant: FAIRCHILD SEMICONDUCTOR CORPORATION, Phoenix, AZ (US)

(72) Inventors: Seungwon Im, Bucheon (KR); Oseob Jeon, Seoul (KR); JoonSeo Son, Seoul (KR); Mankyo Jong, Bucheon (KR); Olaf Zschieschang, Vaterstetten (DE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 214 days.

(21) Appl. No.: 17/316,367

(22) Filed: May 10, 2021

(65) Prior Publication Data
US 2021/0265318 A1 Aug. 26, 2021

Related U.S. Application Data

(63) Continuation of application No. 16/521,695, filed on Jul. 25, 2019, now Pat. No. 11,037,907, which is a
(Continued)

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 23/3735* (2013.01);
(Continued)

(58) Field of Classification Search
CPC ........... H01L 21/565; H01L 2224/2612; H01L 2224/29017; H01L 2224/29018;
(Continued)

(56) References Cited

U.S. PATENT DOCUMENTS 5,130,768 A * 7/1992 Wu .................. H05K 1/141
257/E23.098
6,271,480 B1 * 8/2001 Yamaguti ............... H05K 3/303
174/267
(Continued)

FOREIGN PATENT DOCUMENTS

CN 107346767 A * 11/2017 ........... H01L 23/367
DE 102004027788 A 1/2006
(Continued)

OTHER PUBLICATIONS

Anonymous, Power Electronic Substrate, Wikipedia, Jun. 22, 2020, 3 pages.
(Continued)

*Primary Examiner* — Edward Chin
(74) *Attorney, Agent, or Firm* — IPTechLaw

(57) ABSTRACT

Implementations of semiconductor packages may include: a first substrate having a first dielectric layer coupled between a first metal layer and a second metal layer; a second substrate having a second dielectric layer coupled between a third metal layer and a fourth metal layer. A first die may be coupled with a first electrical spacer coupled in a space between and coupled with the first substrate and the second substrate and a second die may be coupled with a second electrical spacer coupled in a space between and coupled with the first substrate and the second substrate.

20 Claims, 8 Drawing Sheets

Related U.S. Application Data continuation of application No. 15/623,580, filed on Jun. 15, 2017, now Pat. No. 10,403,601.

(60) Provisional application No. 62/351,589, filed on Jun. 17, 2016.

(51) Int. Cl.

| | | |
|---|---|---|
| *H01L 23/00* | (2006.01) | |
| *H01L 23/051* | (2006.01) | |
| *H01L 23/31* | (2006.01) | |
| *H01L 23/373* | (2006.01) | |
| *H01L 23/538* | (2006.01) | |
| *H01L 25/07* | (2006.01) | |

(52) U.S. Cl.
CPC .......... *H01L 23/5385* (2013.01); *H01L 24/00* (2013.01); *H01L 25/072* (2013.01); *H01L 23/051* (2013.01); *H01L 23/3107* (2013.01); *H01L 24/29* (2013.01); *H01L 24/32* (2013.01); *H01L 24/33* (2013.01); *H01L 2224/291* (2013.01); *H01L 2224/32227* (2013.01); *H01L 2224/32245* (2013.01); *H01L 2224/33181* (2013.01); *H01L 2224/83424* (2013.01); *H01L 2224/83447* (2013.01); *H01L 2225/06513* (2013.01); *H01L 2225/06524* (2013.01); *H01L 2225/06527* (2013.01); *H01L 2225/06589* (2013.01)

(58) Field of Classification Search
CPC ..... H01L 2224/291; H01L 2224/32227; H01L 2224/32245; H01L 2224/33181; H01L 2224/83424; H01L 2224/83447; H01L 2225/06513; H01L 2225/06524; H01L 2225/06527; H01L 2225/06589; H01L 23/051; H01L 23/3107; H01L 23/3735; H01L 23/5385; H01L 24/00; H01L 24/29; H01L 24/32; H01L 24/33; H01L 25/0657; H01L 25/072; H01L 2924/00012; H01L 2924/00014; H01L 2924/014; H02B 1/24; H02B 1/04; H05K 1/181
See application file for complete search history.

(56) References Cited

U.S. PATENT DOCUMENTS

| | | | | |
|---|---|---|---|---|
| 6,324,072 | B1* | 11/2001 | Lorenz | H01L 25/072 361/720 |
| 6,790,056 | B2* | 9/2004 | Buondelmonte | H05K 3/368 439/83 |
| 7,005,734 | B2 | 2/2006 | Choi et al. | |
| 7,456,492 | B2 | 11/2008 | Mochida | |
| 8,367,478 | B2* | 2/2013 | Bartley | H01L 29/0657 257/713 |
| 9,355,950 | B1 | 5/2016 | Bayerer | |
| 2001/0033477 | A1 | 10/2001 | Inoue et al. | |
| 2003/0001254 | A1* | 1/2003 | Jackson | H01L 24/14 257/691 |
| 2004/0239349 | A1* | 12/2004 | Yamagishi | G01R 1/07378 324/754.07 |
| 2005/0047186 | A1* | 3/2005 | Gerbsch | H01L 23/5385 257/E23.172 |
| 2006/0043552 | A1* | 3/2006 | Suga | H01L 24/13 257/E21.511 |
| 2006/0044773 | A1* | 3/2006 | Akram | H01L 25/0657 257/E25.013 |
| 2006/0249827 | A1* | 11/2006 | Fasano | H01L 25/0657 257/E25.013 |
| 2006/0292751 | A1 | 12/2006 | Brandenburg et al. | |
| 2007/0216013 | A1 | 9/2007 | Funakoshi et al. | |
| 2008/0054439 | A1* | 3/2008 | Malhan | H01L 23/5385 257/E23.071 |
| 2008/0090427 | A1* | 4/2008 | Humpston | H01L 23/49811 439/66 |
| 2009/0051004 | A1* | 2/2009 | Roth | H01L 23/49816 438/106 |
| 2009/0113698 | A1* | 5/2009 | Love | H05K 1/141 439/70 |
| 2009/0273068 | A1* | 11/2009 | Kaskoun | H01L 25/0657 257/E21.532 |
| 2010/0326210 | A1* | 12/2010 | Stein | A61B 5/4528 73/865.4 |
| 2011/0037166 | A1 | 2/2011 | Ikeda et al. | |
| 2012/0106220 | A1 | 5/2012 | Yamaguchi et al. | |
| 2012/0320529 | A1* | 12/2012 | Loong | H05K 7/20927 29/890.035 |
| 2013/0020694 | A1* | 1/2013 | Liang | H01L 23/473 257/691 |
| 2013/0050947 | A1 | 2/2013 | Kadoguchi et al. | |
| 2013/0056185 | A1 | 3/2013 | Bayerer et al. | |
| 2013/0062743 | A1* | 3/2013 | Kim | H01L 23/49811 438/122 |
| 2013/0099626 | A1* | 4/2013 | Takeuchi | H02N 1/08 310/300 |
| 2013/0113090 | A1 | 5/2013 | Atsumi | |
| 2013/0134569 | A1* | 5/2013 | Ha | H01L 23/49811 257/676 |
| 2013/0147027 | A1* | 6/2013 | Ha | H01L 23/49833 257/706 |
| 2013/0201614 | A1* | 8/2013 | Keil | H01L 21/565 361/679.01 |
| 2014/0021640 | A1* | 1/2014 | Paques | H01L 23/13 257/778 |
| 2014/0146487 | A1* | 5/2014 | Sohn | H01L 24/72 361/736 |
| 2014/0185243 | A1* | 7/2014 | Joo | H05K 7/20927 361/709 |
| 2014/0265848 | A1* | 9/2014 | Cheng | H01T 23/00 315/111.21 |
| 2014/0327127 | A1* | 11/2014 | Hable | H01L 24/36 438/122 |
| 2015/0048520 | A1* | 2/2015 | Skinner | H01L 24/16 257/777 |
| 2015/0318126 | A1* | 11/2015 | Hessler | B29C 45/14065 29/622 |
| 2016/0064302 | A1 | 3/2016 | Yamada | |
| 2016/0064308 | A1 | 3/2016 | Yamada | |
| 2016/0126157 | A1* | 5/2016 | Jeon | H01L 23/051 257/693 |
| 2016/0225693 | A1* | 8/2016 | Tolentino | H01L 23/315 |
| 2017/0197511 | A1* | 7/2017 | Yonak | H02P 27/06 |
| 2017/0323847 | A1* | 11/2017 | Jeon | H01L 23/4334 |
| 2019/0019641 | A1* | 1/2019 | Signer | H05K 1/0201 |
| 2020/0066647 | A1* | 2/2020 | Shiizaki | H01L 23/49575 |

FOREIGN PATENT DOCUMENTS

| | | | |
|---|---|---|---|
| DE | 102007005233 A | 8/2008 | |
| DE | 102015105575 | * 10/2015 | |
| EP | 1148547 A | 10/2001 | |
| EP | 2312916 A2 | 4/2011 | |
| EP | 2312916 A3 | 7/2012 | |
| EP | 2660858 A | 11/2013 | |
| EP | 4174936 A1 | * 5/2023 | ............. H01L 23/13 |
| JP | S56101749 A | 8/1981 | |
| JP | S5943525 A | 3/1984 | |
| JP | S6054780 B | 12/1985 | |
| KR | 20130029267 | 3/2013 | |

OTHER PUBLICATIONS

Haque S et al., An Innovative Technique for Packaging Power Electronic Building Blocks Using Metal Posts Interconnected Parallel Plate Structures, IEEE Transactions on Advanced Packaging, vol. 22, No. 2, May 1999, pp. 136-144.

(56) References Cited

OTHER PUBLICATIONS

International Search Report and Written Opinion, PCT Patent Application No. PCT/US2017/037996, Feb. 2, 2018, 29 pages.

* cited by examiner

SEMICONDUCTOR PACKAGE AND RELATED METHODS

CROSS REFERENCE TO RELATED APPLICATIONS

This document claims the benefit of the filing date of U.S. Provisional Patent Application 62/351,589, entitled "Module with multiple substrates" to Zschieschang et al. which was filed on Jun. 17, 2016, the disclosure of which is hereby incorporated entirely herein by reference.

This application is also a continuation application of the earlier U.S. Utility Patent Application to Im et. al. entitled "Semiconductor Package and Related Methods," application Ser. No. 16/521,695, filed Jul. 25, 2019, now pending, which application is a continuation application of the earlier U.S. Utility Patent Application to Im et. al. entitled "Semiconductor Package and Related Methods," application Ser. No. 15/623,580, filed Jun. 15, 2017, now issued as U.S. Pat. No. 10,403,601, the disclosures of each of which are hereby incorporated entirely herein by reference.

BACKGROUND

1. Technical Field

Aspects of this document relate generally to semiconductor packages, such as power modules used in automobiles.

2. Background

Semiconductor packages may be required to withstand large quantities of heat and power generation while in operation. The build-up of heat can negatively affect the functioning and structure of the semiconductor package.

SUMMARY

Implementations of semiconductor packages may include: a first substrate having a first dielectric layer coupled between a first metal layer and a second metal layer; a second substrate having a second dielectric layer coupled between a third metal layer and a fourth metal layer and a first die may be coupled with a first electrical spacer coupled in a space between and coupled with the first substrate and the second substrate. A second die may be coupled with a second electrical spacer coupled in a space between and coupled with the first substrate and the second substrate.

Implementations of semiconductor packages may include one, all, or any of the following:

The first dielectric layer may include an extension extending beyond a length of the first metal layer and a length of the second metal layer, where the length of the first metal layer and the length of the second metal layer are the same; and the second dielectric layer may include an extension extending beyond a length of the third metal layer and a length of the fourth metal layer, where the length of the third metal layer and the length of the fourth metal layer are the same.

The first dielectric layer may include an extension that may extend beyond a length of the first metal layer and a length of the second metal layer, wherein the length of the first metal layer and the length of the second metal layer are the same, and wherein the length of the third metal layer and the length of the fourth metal layer are the same. The extension portion of the first dielectric layer may extend beyond a length of the third metal layer and a length of the fourth metal layer. An extension portion of the second dielectric layer may extend beyond the length of the extension of the first dielectric layer. The lengths of the third and the fourth metal layers extend beyond the lengths of the first and the second metal layers.

The first electrical spaces may be coupled with the second metal layer, the first die may be coupled with the third metal layer, the second electrical spacer may be coupled with the third metal layer, and the second die may be coupled with the second metal layer.

Both the first electrical spacer and the second metal spacer may be coupled with the third metal layer and both the first die and the second die are coupled with the second metal layer.

The substrates may be biased relative to a molding apparatus by two or more springs.

The first die and the second die may include one of a bipolar junction transistor (BJT), an insulated gate bipolar transistor (IGBT), a superjunction field effect transistor (FET), a metal oxide semiconductor field effect transistor (MOSFET) device, a silicon carbide (SiC) device, a SiC BJT, a diode, a Schottky diode, and combination thereof.

The electrical spacers may be coupled with the die through solder.

Implementations of semiconductor packages may include: a first substrate having a first dielectric layer coupled between a first metal layer and a second metal layer. The first dielectric layer may include an extension portion extending beyond a length of the first metal layer and a length of the second metal layer and where the length of the first metal layer and the length of the second metal layer are the same. The semiconductor package may also include a second substrate having a second dielectric layer coupled between a third metal layer and a fourth metal layer. The second dielectric layer may include an extension portion extending beyond a length of the third metal layer and a length of the fourth metal layer and where the length of the third metal layer and the length of the fourth metal layer are the same. A first die may be coupled with a first electrical spacer coupled in a space between and coupled to the first substrate and the second substrate. A first side of the first die may be coupled with one of the second metal layer and the third metal layer. A second side of the die may be coupled with a first side of the first electrical spacer. A second side of the first electrical spacer may be coupled with one of the second metal layer or the third metal layer. A second die may be coupled with a second electrical spacer coupled in a space between and coupled to the first substrate and the second substrate. A first side of the second die may be coupled with one of the second metal layer and the third metal layer. The second side of the die may be coupled with a first side of the first electrical spacer. A second side of the first electrical spacer may be coupled with one of the second metal layer and the third metal layer.

Implementations of semiconductor packages may include one, all, or any of the following:

The extension portion of the second dielectric layer and the extension portion of the first dielectric layer may include substantially similar lengths.

The extension portion of the second dielectric layer may extend beyond the extension portion of the first dielectric and the lengths of the third and the fourth metal layers may be longer than the lengths of the first and the second metal layers.

The substrate may be biased by two or more springs relative to a molding apparatus.

Each of the first metal layer, the second metal layer, the third metal layer and the fourth metal layer may include one of copper, aluminum, or any combination thereof.

The first die and the second die may include one of a bipolar junction transistor (BJT), an insulated gate bipolar transistor (IGBT), a superjunction field effect transistor (FET), a metal oxide semiconductor field effect transistor (MOSFET) device, a silicon carbide (SiC) device, a SiC BJT, a diode, a Schottky diode, or combination thereof.

The first electrical spacer may be coupled with the second metal layer, the first die may be coupled with the third metal layer, the second electrical spacer may be coupled with the third metal layer and the second die may be coupled with the second metal layer.

Both the first electrical spacer and the second electrical spacer may be coupled with the third metal layer and both the first die and the second die may be coupled with the second metal layer.

Implementations of semiconductor packages may include: a first substrate including a first dielectric layer coupled between a first metal layer and a second metal layer; a second substrate including a second dielectric layer coupled between a third metal layer and a fourth metal layer; a first die coupled with a first electrical spacer coupled in a space between the first substrate and the second substrate; a second die coupled with a second electrical spacer coupled in a space between the first substrate and the second substrate; and one or more flexible electrical supports coupled between the first substrate and the second substrate.

Implementations of semiconductor packages may include one, all, or any of the following:

The one or more flexible electrical supports may include one of a spring, a pin, a flexible member, a sponge-like structure, a clip, and any combination thereof.

The one or more flexible electrical supports may include a shape including one of a square, a rectangle, a closed hexagonal, an open rhomboid, a closed rhomboid, a circle, an oval, an ellipse, and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 7E is a view of the implementation of the semiconductor package from FIG. 7A with a the top substrate being see through;

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductors and implementing components and methods, consistent with the intended operation and methods.

Figure 1:
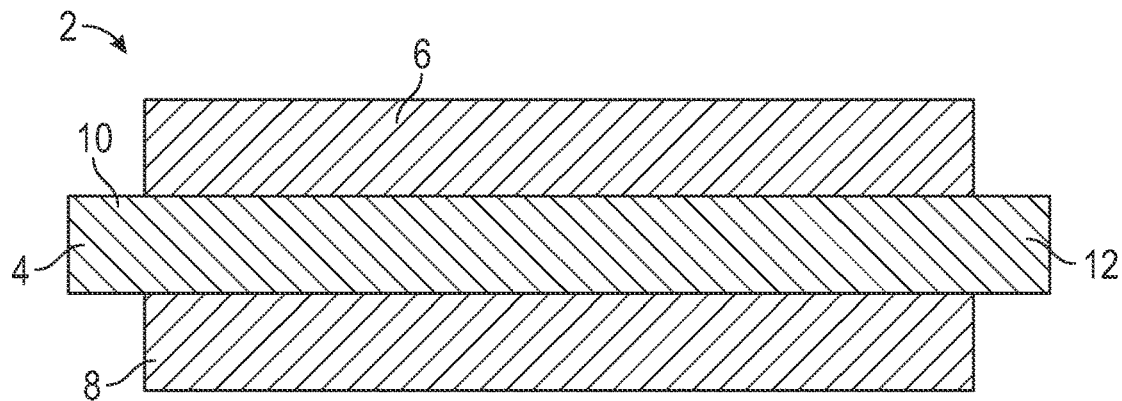
FIG. 1 is a view of an implementation of a substrate as described herein.

Referring to FIG. 1, an implementation of a substrate 2 is illustrated. The substrate 2 includes a dielectric layer 4 coupled between a first metal layer 6 and a second metal layer. The dielectric layer has an extension portion 10 and 12 extending beyond the length of the first metal layer 6 and a length of the second metal layer 8. The length of the first metal layer 6 and the length of the second metal layer 8. The extension portions of the dielectric layer may provide extra structure to a semiconductor package to preserve the integrity of the package during the molding and packaging process. The extension portions may also help preserve the integrity of the package during performance. The dielectric layer 4 coupled between the first metal layer 6 and the second metal layer 8 may allow heat to dissipate from a semiconductor package without losing power. The dielectric layer 4 may include, by non-limiting example, a ceramic material, a pre-molded material, an organic material, silicon dioxide, silicon nitride, or other suitable electrically non-conductive material known in the art. The dielectric layer 4 may be coupled to the first metal layer and second metal layer through, by non-limiting example, solder, heat specific bonding such as eutectic bonding, sintering, or other known methods in the art. The first metal layer 6 and the second metal layer 8 may include, by non-limiting example, copper, aluminum, and other well-known electrical conductors. The substrate 2 may also include one or more layers, stacked layers, of alternating metal layers and dielectric layers. In various implementations, the substrate 2 may also have different shapes including rectangular, square, or other closed shapes of varying dimensions.

Figure 2:
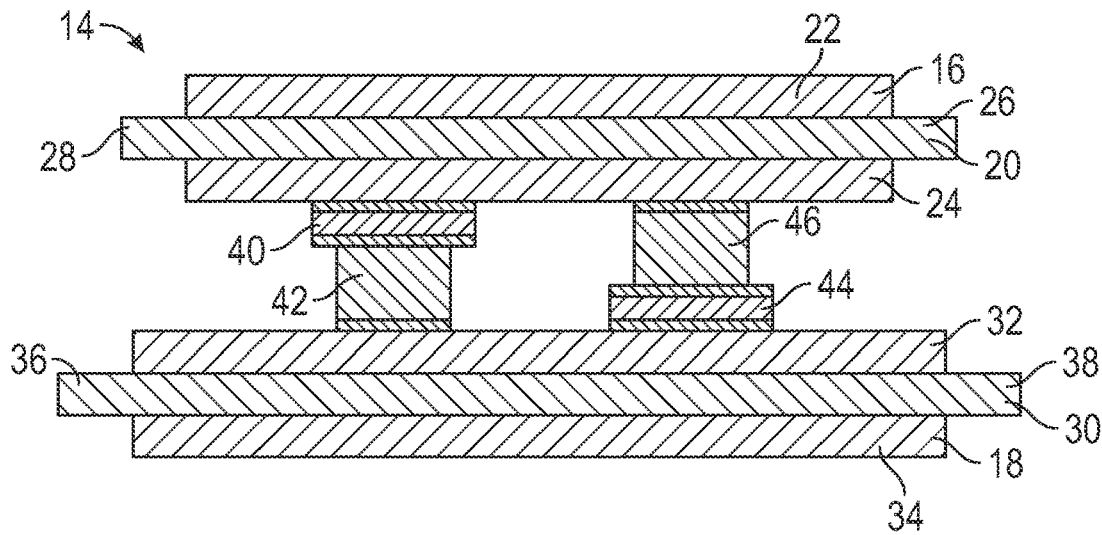
FIG. 2 is a view of an implementation of a semiconductor package having implementations of substrates as described herein.

Referring to FIG. 2, an implementation of a semiconductor package 14 is illustrated. This view does not include leads and other connection which would be included in a fully assembled semiconductor package for the sake of clarity. The semiconductor package includes a first substrate 16 and a second substrate 18. As previously described, the first substrate includes a dielectric layer 20 coupled between a first metal layer 22 and a second metal layer 24. The dielectric layer 20 may have an extension portion 26 and 28 extending beyond a length of the first metal layer 22 and a length of the second metal layer 24 where the length of the first metal layer 22 and the length of second metal layer 24 are the same. The second substrate 18 may include a second dielectric layer 30 coupled between a third metal layer 32 and a fourth metal layer 34. The second dielectric layer 30 may also include an extension portion 36 and 38 extending beyond a length of the third metal layer 32 and a length of the fourth metal layer 34 where the length of the third metal layer 32 and the length of the fourth metal layer 34 are the same. The extension portion 26 and 28 of the first dielectric layer 20 extends beyond a length of the third metal layer 32 and a length of the fourth metal layer 34. An extension portion 36 and 38 of the second dielectric layer 30 extends beyond the length of the extension 26 and 28 of the first dielectric layer 20. The lengths of the third metal layer 32 and the fourth metal layer 34 extend beyond the length of the first metal layer 22 and the second metal layer 24. As previously described, the dielectric layers may include any of the dielectric materials disclosed herein, such as ceramic materials including aluminum nitride, alumina; pre-molded materials; organic materials; silicon dioxide; silicon nitride; or other suitable materials known in the art. In various implementations, the metal layers may be any disclosed in this document.

Referring to the inside of the semiconductor package of FIG. 2, a first die 40 is coupled with a first electrical spacer 42. Electrical spacers may also be referred to as conductive spacers in this document. The first die 40 and the first electrical spacer 42 are coupled in a space between and coupled with the first substrate 16 and the second substrate 18. In various implementations, the first die 40 may be coupled to the first electrical spacer 42 through solder. The first die and the first electrical spacer may be coupled to the first substrate and the second substrate, respectively, through solder or other suitable materials known in the art. A second die 44 is coupled with a second electrical spacer 46. The second die 44 and the second electrical spacer 46 may be coupled through solder. The second die 44 and the second electrical spacer 46 are coupled in a space between and coupled with the first substrate 16 and the second substrate 18. In various implementations, the first die 40 may be coupled to the second metal layer 24 and the first electrical spacer 42 may be coupled to the third metal layer 32 of the package while the second die 44 may be coupled to the third metal layer 32 and the second electrical spacer 46 may be coupled to the second metal layer 24. The first die 40 and the second die 44 may include, by non-limiting example, one of a bipolar junction transistor (BJT), an insulated gate bipolar transistor (IGBT), a superjunction field effect transistor (FET), a metal oxide semiconductor field effect transistor (MOSFET) device, a silicon carbide (SiC) device, a SiC BJT, a diode, a Schottky diode, or combination thereof.

Figure 3:
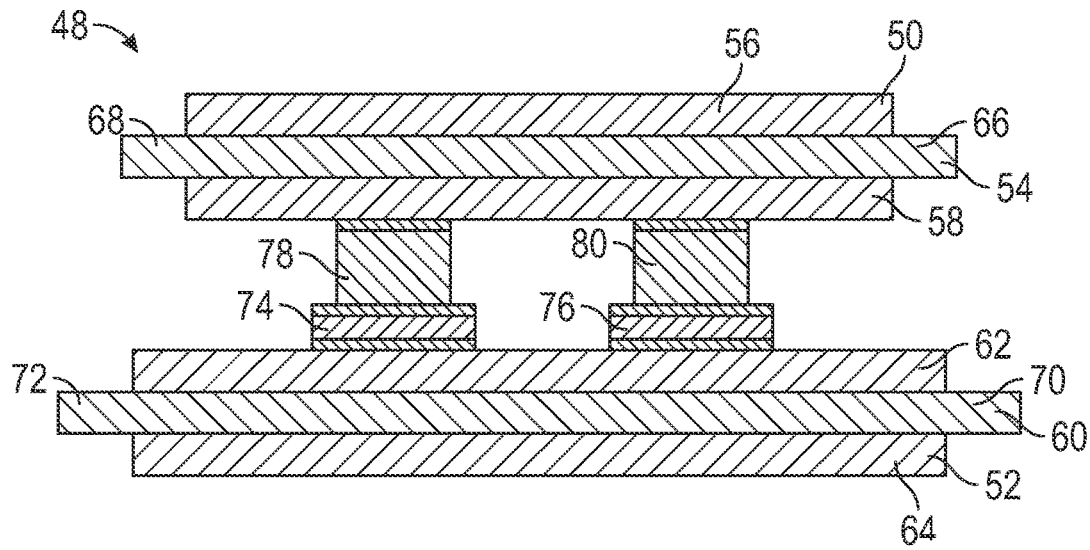
FIG. 3 is a view of another implementation of a semiconductor package having implementations of substrates as described herein.

Referring to FIG. 3, an implementation of another semiconductor package 48 is illustrated. This view also does not include leads and other connection which would be included in a fully assembled semiconductor package. The package 48 includes a first substrate 50 and a second substrate 52. The first substrate 50 includes a first dielectric layer 54 coupled between a first metal layer 56 and a second metal layer 58. The first dielectric layer 54 includes an extension portion 66 and 68 that extends beyond the length of the first metal layer 56 and the second metal layer 58 where the first metal layer 56 and the second metal layer 58 are the same length. The second substrate 52 includes a second dielectric layer 60 coupled between a third metal layer 62 and a fourth metal layer 64. The second dielectric layer 60 also has an extension portion 70 and 72 that extends beyond the length of the third metal layer 62 and the fourth metal layer 64. As described in a previous implementation, the extension portion 66 and 68 of the first dielectric layer 54 extends beyond a length of the third metal layer 62 and the fourth metal layer.

Coupled in a space between the first substrate 50 and the second substrate 60 are a first die 74 and a second die 76. The first die 74 is coupled with a first electrical spacer 78. The first die 74 is coupled to a first electrical spacer 78 on one side and the third metal layer 62 on the other side through, by non-limiting example, a soldering material. The first electrical spacer 78 is coupled to the first die on one side and coupled to the second metal layer 58 on the other side. The first electrical spacer 78 may likewise be coupled to the second metal layer 58 through a soldering material. In this implementation, the first die 74 and the second die 76 are in a similar orientation both coupled to the third metal layer 62. This arrangement is different that the implementation in FIG. 2 where the first die 40 and the second die 44 were coupled to different metal layers, as in this version the die are coupled to the same metal layer. In various implementations, the first die and the second die may include one of a bipolar junction transistor (BJT), an insulated gate bipolar transistor (IGBT), a superjunction field effect transistor (FET), a metal oxide semiconductor field effect transistor (MOSFET) device, a silicon carbide (SiC) device, a SiC BJT, a diode, a Schottky diode, or combination thereof.

Figure 4:
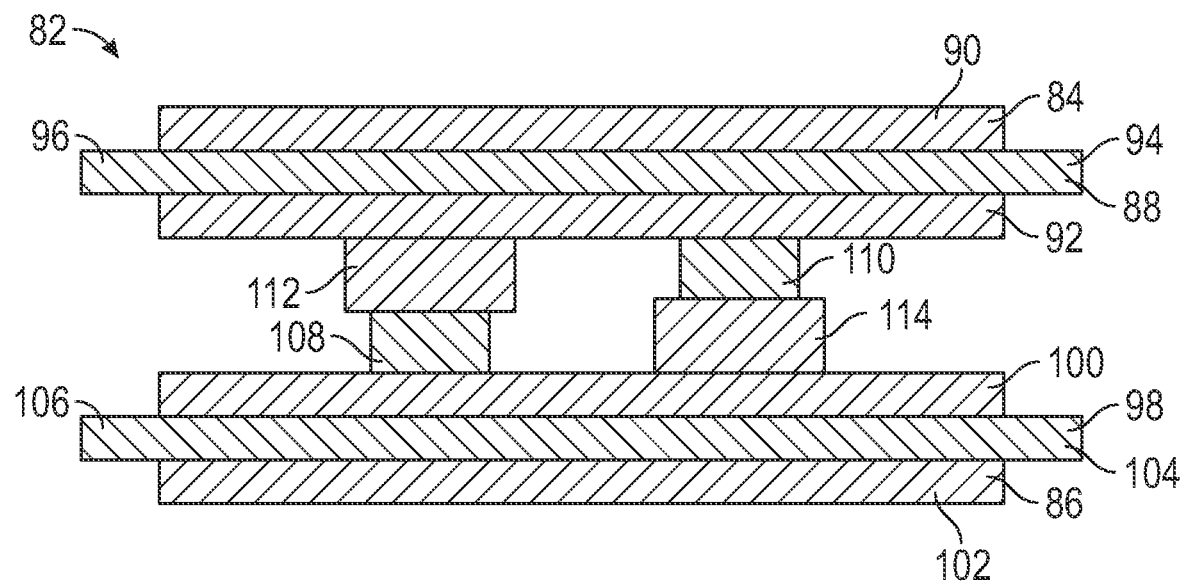
FIG. 4 is a view of an implementation of a semiconductor package having substrates with the same length.

Referring to FIG. 4, an implementation of a semiconductor package 82 is illustrated. This view does not include leads and other connectors which would be included in a fully assembled semiconductor package. In this implementation, the package includes a first substrate 84 and a second substrate 86. The first substrate 84 includes a first dielectric layer 88 coupled between a first metal layer 90 and a second metal layer 92. The first dielectric layer 88 includes an extension portion 94 and 96 that extends beyond the length of the first metal layer 90 and the second metal layer 92. The length of the first metal layer 90 and the length of the second metal layer 92 are the same. The second substrate 86 includes a second dielectric layer 98 coupled between a third metal layer 100 and a fourth metal layer 102. The second dielectric layer 98 includes an extension portion 104 and 106 that extends beyond the length of the third metal layer 100 and the length the fourth metal layer 102 where the length of the third metal layer 100 and fourth metal layer 102 are the same. In this implementation of a semiconductor package 82, the length of the first substrate 84 and the second substrate 86 is the same including the length of the first dielectric layer 88 and the length of the second dielectric layer 98.

A first die 108 and a second die 110 are coupled in a space between the first substrate 84 and the second substrate 86. A first side of the first die 108 is coupled to a second side of the first electrical spacer 112 and a second side of the first die 108 is coupled with the third metal layer 100. The first side of the first electrical spacer 112 is coupled with the second metal layer 92. The orientation of the first die may be described as face down. The first die 108 may be coupled with both the second metal layer 92 and the electrical spacer 112 through solder. A first side of the second die 110 is coupled to the second metal layer 92 and the second side of the first die 110 is coupled to the first side of a second electrical spacer 114. The orientation of the second die may be referred to as face up.

Figure 5:
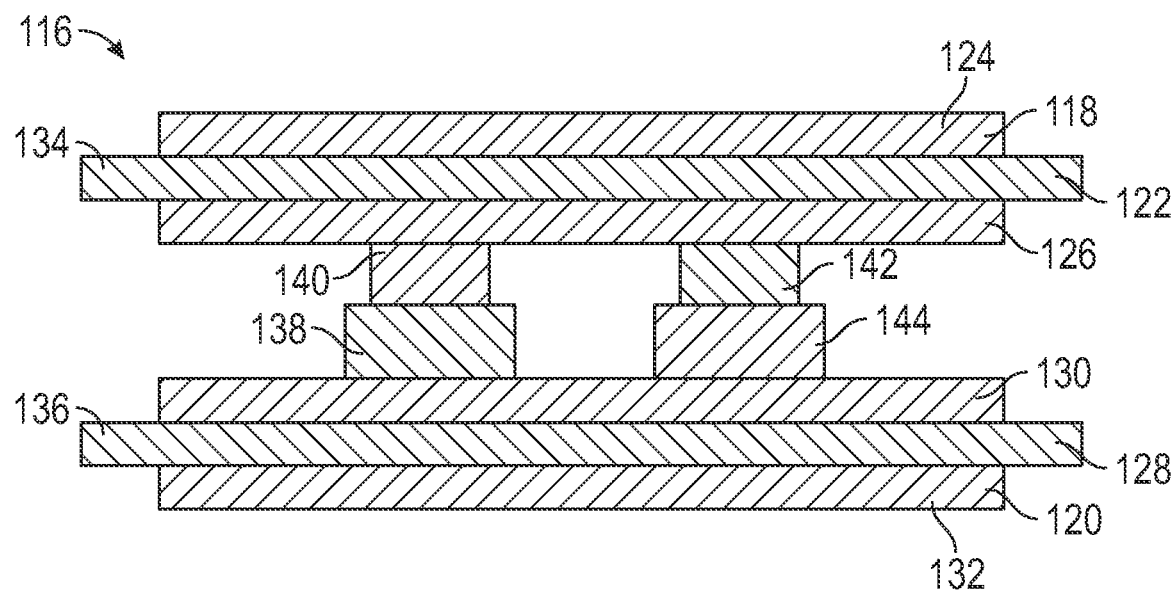
FIG. 5 is a view of another implementation of a semiconductor package having substrates with the same length.

Referring to FIG. 5, another implementation of a semiconductor package 116 is illustrated. This view also does not include leads and other connection which would be included in a fully assembled semiconductor package. This implementation 116 also includes a first substrate 118 and a second substrate 120. The first substrate 118 includes a first dielectric layer 122 coupled between a first metal layer 124 and a second metal layer 126. The second substrate 120 similarly includes a second dielectric layer 128 coupled between a third metal layer 130 and a fourth metal layer 132. Each of the first dielectric layer 122 and the second dielectric layer 128 include an extension portion 134 and 136, respectively, that extends beyond the first metal layer 124, second metal layer 126, third metal layer 130 and fourth metal layer 132, respectively. In this implementation, the extension portions of the first dielectric layer 122 and second dielectric layer 128 have the same length. In other implementations, the second dielectric layer may have an extension portion that extends beyond the length of the first dielectric layer extension portion. Also in this implementation, the lengths of the first metal layer 124, second metal layer 126, third metal layer 130, and fourth metal layer 132 are the same.

A first die 138 is coupled with a first electrical spacer 140. The first die 138 and the first electrical spacer 140 are coupled in a space between and coupled with the first substrate 118 and the second substrate 120. A second die 142 is coupled with a second electrical spacer 144. The second die 142 and the second electrical spacer 144 are coupled in a space between and coupled with the first substrate 118 and the second substrate 120. The die and the electrical spacers may be coupled to each other and may be coupled to the substrates through solder. In this particular implementation, both the first die 138 and the second die 142 are coupled in a face up position, where a face up position is defined as the first side of a die coupled to the second metal layer and the second side of the side coupled to the first side of the electrical spacer. In other implementations, the first die and the second die may be positioned in opposite orientations with one die facing up and another die facing down as previously described.

Figure 6:
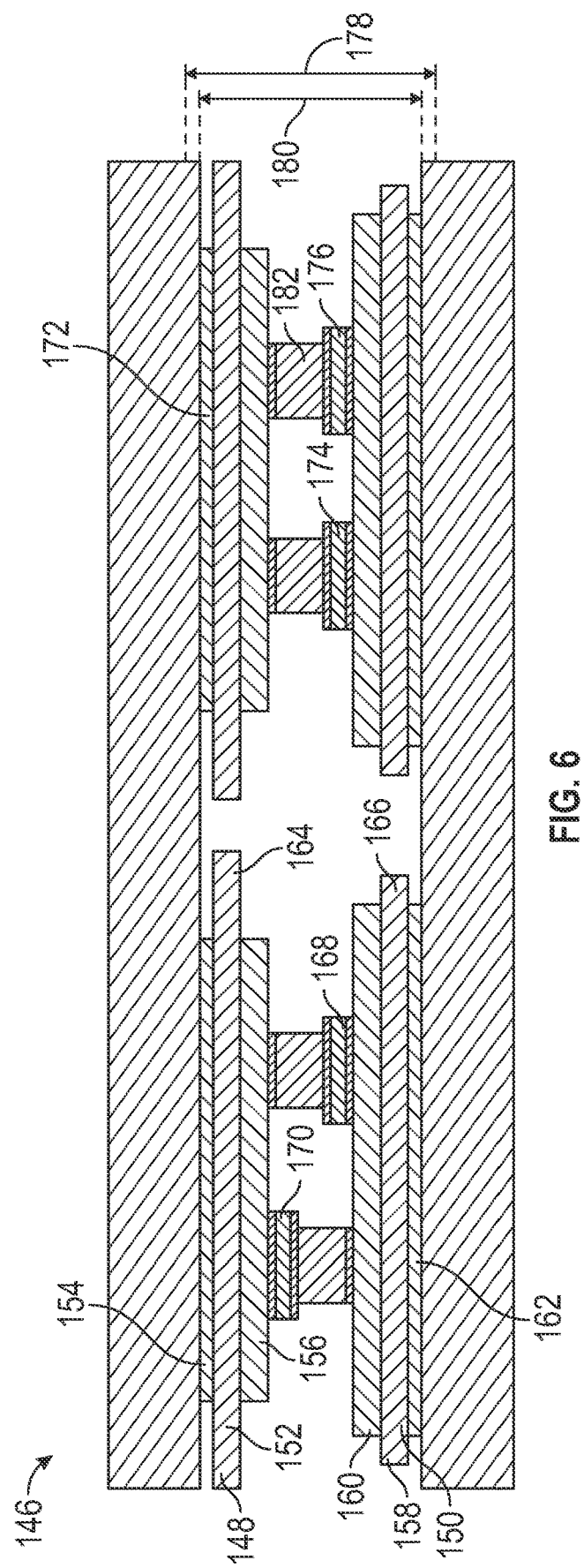
FIG. 6 is a view of an implementation of transfer molded module.

Referring now to FIG. 6, an implementation of a transfer molded module 146 is illustrated. This view does not include leads and other connection which would be included in a fully assembled semiconductor module. This implementation of a transfer molded module includes two semiconductor packages as previously described. Each semiconductor package includes a first substrate 148 and a second substrate 150. The first substrate 148 includes a first dielectric layer 152 coupled between a first metal layer 154 and a second metal layer 156. The second substrate 150 includes a second dielectric layer 158 coupled between a third metal layer 160 and a fourth metal layer 162. The first dielectric layer 152 has an extension portion 164 that extends beyond a length of the first metal layer 154 and second metal layer 156 where the length of the first metal layer 154 and the second metal layer 156 are the same. The extension portion 164 of the first dielectric layer also extends beyond the length of the third metal layer 160 and fourth metal layer 162 where the length of the third metal layer 160 and the fourth metal layer 162 are the same. In this particular implementation, the length of the third metal layer 160 and the fourth metal layer 162 is longer than the length of the first metal layer 154 and the second metal layer 156. The second dielectric layer 158 also has an extension portion 166 that extends beyond the length of the third metal layer 160 and the fourth metal layer 162. The extension portion 166 of the second dielectric layer 158 also extends beyond the extension portion 164 of the first dielectric layer 152. In this implementation, one semiconductor package includes dies 168 and 170 that are in opposite orientations where one die is face up 168, as previously described, and one die is face down 170, as previously described. In the other semiconductor package 172, the die 174 and 176 are in the same face up orientation as previously described. In other implementations, the dies in each of the semiconductor packages may have the same or different orientation. For example, all the die in the power module may be face up or some die may be face up and some may be face down.

FIG. 6 also illustrates the mold tolerance of the power module. The all material tolerance 178 can be greater than the mold chase tolerance 180. The substrate thickness tolerance may be a maximum of +7 to −10% of the thickness or +/−0.08 mm thick. The electrical spacer thickness tolerance is approximately +/−0.05 mm. The use of solder to couple the die, electrical spacers and substrates may increase the all material tolerance. These tolerances may provide challenges during the transfer molding process including damage to die, substrate, and the electrical spacer during the molding clamping process.

Figure 7A:
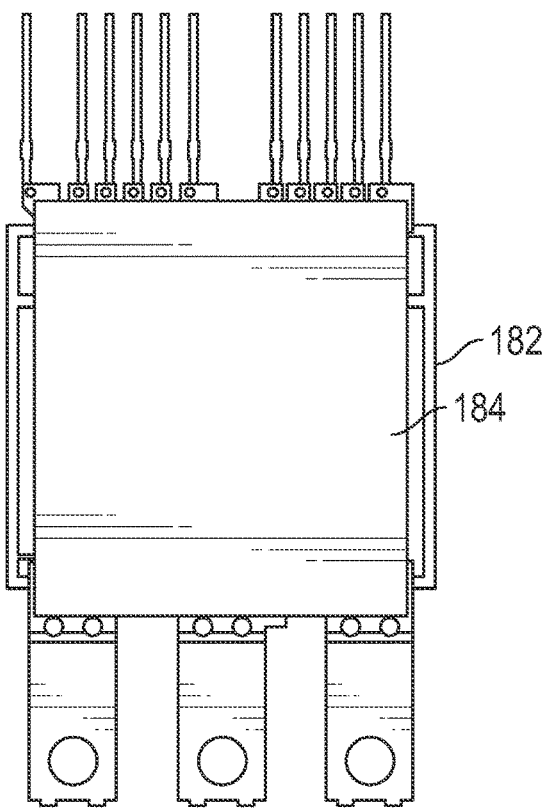
FIG. 7A is a top view of an implementation of a semiconductor package.
Figure 7B:
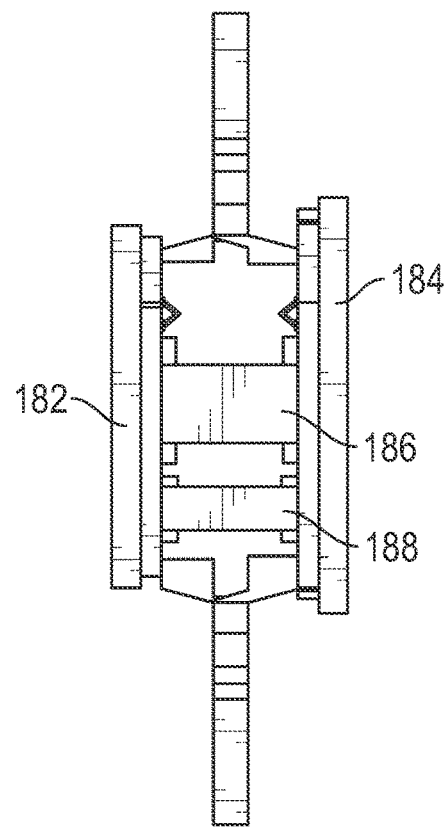
FIG. 7B is a side view of an implementation of a semiconductor package from FIG. 7A.
Figure 7C:
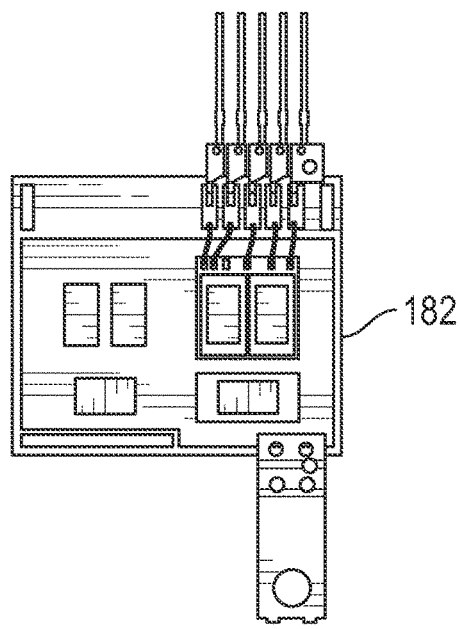
FIG. 7C is an inside view of one half of the implementation of the semiconductor package from FIG. 7A.
Figure 7D:
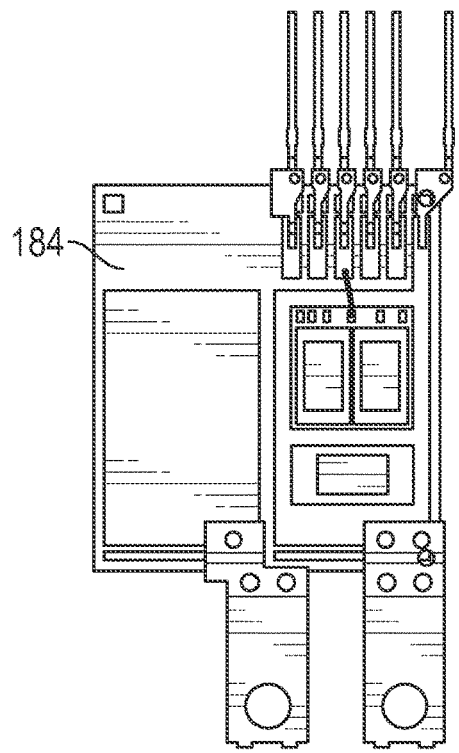
FIG. 7D is an inside view of the other half of the implementation of the semiconductor package from FIG. 7A.

These technical challenges may be addressed through total height control of the assembly and a transfer mold combination. For example, the total power module assembled tolerance may be mitigated by using different sized substrates for the first substrate and the second substrate. Referring to FIGS. 7A-7E, an implementation of a power module is illustrated. In FIG. 7A, the differing sizes of the first substrate 182 and the second substrate 184 is illustrated. In some implementations, by non-limiting example, the substrates may include direct bonded copper (DBC) substrates. In various implementations, both the first substrate and the second substrate may be different sizes and dimensions of rectangles. Referring to FIG. 7B, a side view of the power module is illustrated. In FIG. 7C, the first substrate 182 is illustrated without the second substrate. In FIG. 7D, the second substrate 184 is illustrated without the first substrate.

Figure 7E:
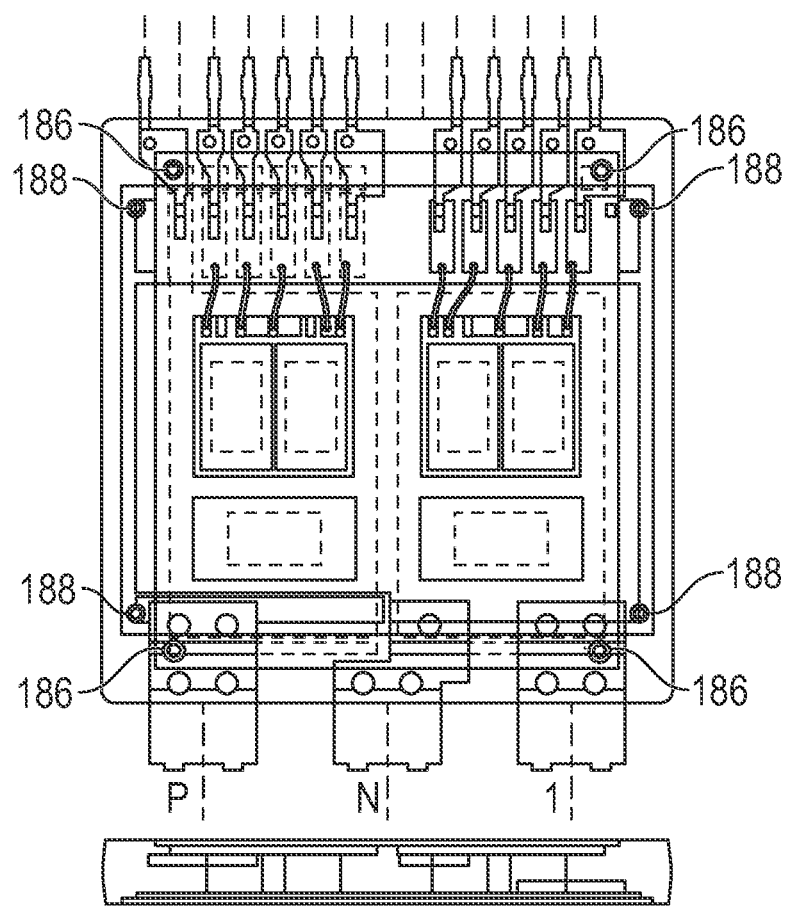
Figure 8:
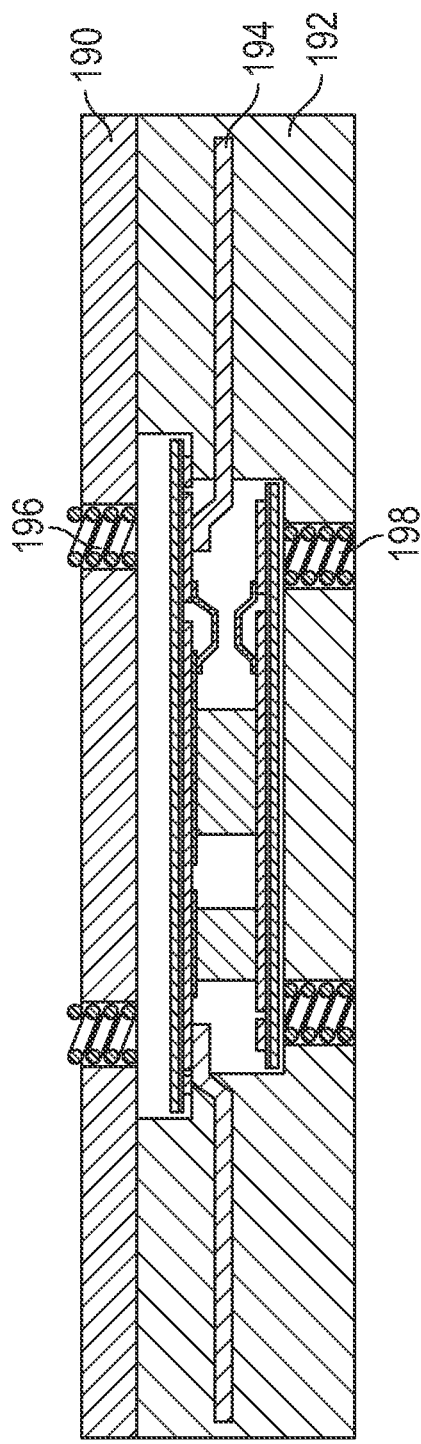
FIG. 8 is a side view of an implementation of a semiconductor package in a jig.
Figure 9:
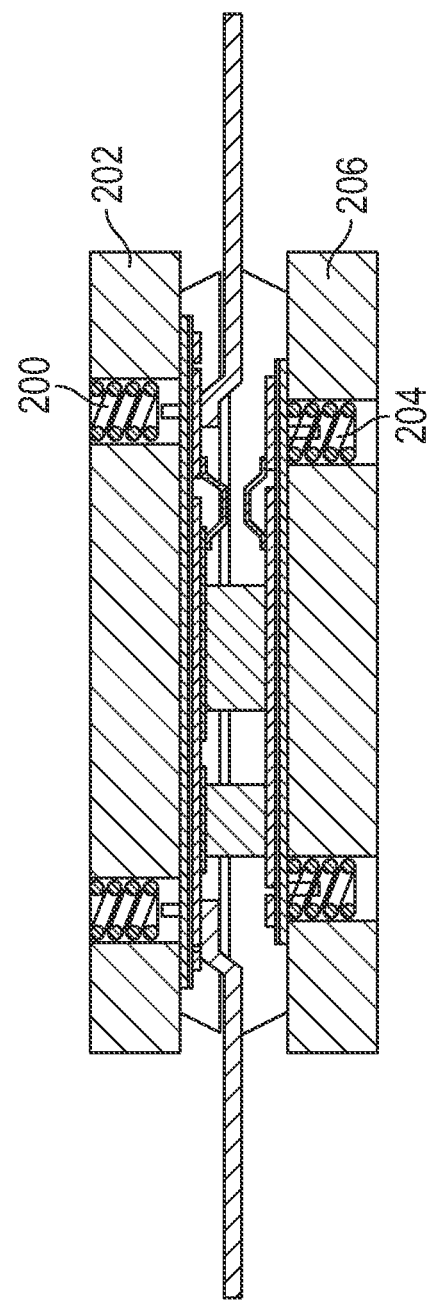
FIG. 9 is a side view of an implementation of a semiconductor package with support pins.

Referring to FIG. 7E, another view of the power module is illustrated. In this view, pins are illustrated 186 and 188. The pins are one example of support structures that may be used to reduce the force of the transfer molding process on the die, substrate and electrical spacers as previously described. The support structures may also include springs where two or more springs bias the substrates relative to a molding apparatus as illustrated in FIGS. 8 and 9. The molding process includes placing a semiconductor package in a molding machine which may include a top jig 190 and a bottom jig 192 as illustrated in FIG. 8. Epoxy or another molding material is softened through heat or pressure and is then forced by a ram into the liquid state. The ram then forces the liquid around the die in the package. The package may include lead frames 194. The springs 196 and 198 may help to mitigate the force experienced by the components of the package. In FIG. 9, the package is illustrated after the molding process having springs 200 in the top chase 202 and springs 204 in the bottom chase 206.

Figure 10A:
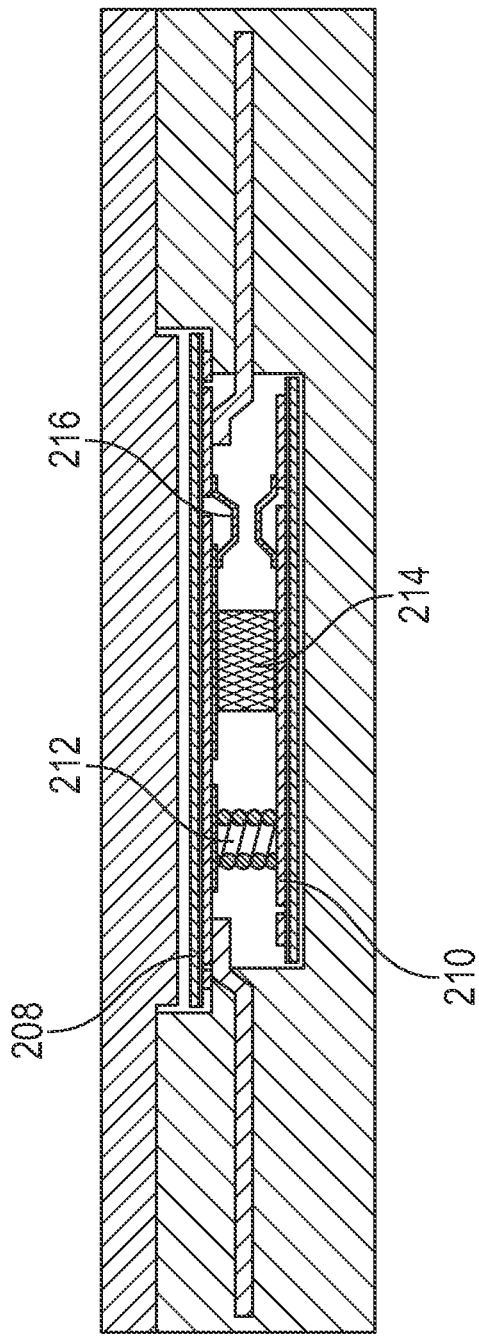
FIG. 10A-10C are views of various implementations of flexible interconnects in a semiconductor packages as described herein.
Figure 10B:
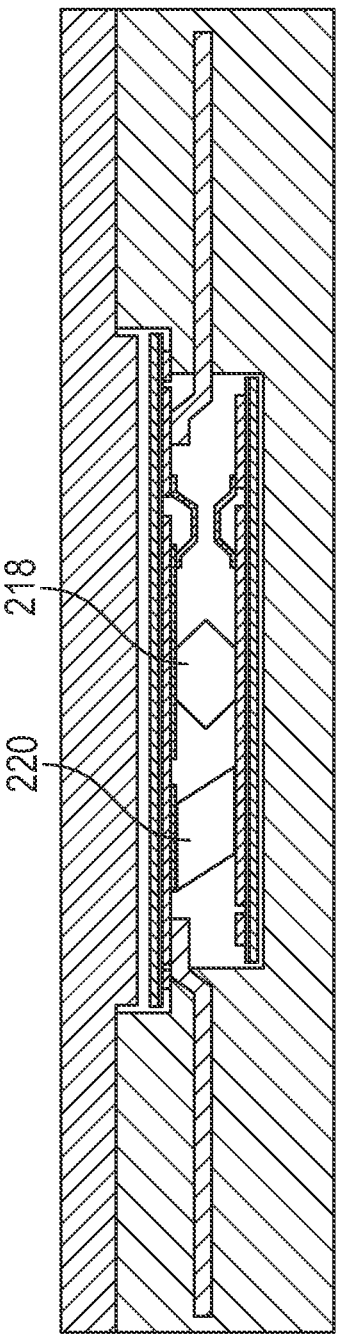
Figure 10C:
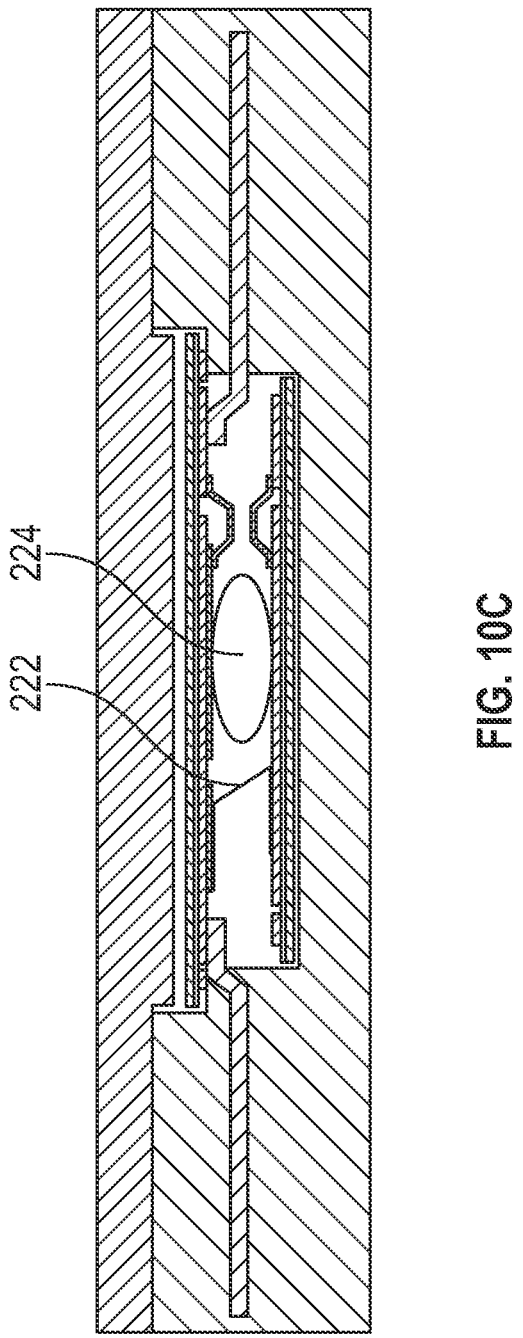

Referring to FIGS. 10A-10C, various implementations of flexible interconnection supports are illustrated. The flexible supports/members may be used to provide an interconnect between a first substrate 208 and a second substrate 210. The flexible members may also be used between a die and a substrate. The flexible interconnects are intended to compensate for the tolerances of the materials in the stack in the soldering and/or molding process. The flexible interconnects may also assure that the substrate backsides are firmly connecting both sides of the mold cavity. The flexible members may be spacers for the electrical interconnects. They may also integrate a spring biasing function which can be, by non-limiting example, a spiral spring 212, a sponge-like structure 214, or a clip of various shapes 216. The clips may have shapes including closed hexagonal 218, closed rhomboid 220, open rhomboid 222, round or oval 224. The flexible supports would be designed so that the overall height of the spacer is able to compensate the minimum stacked tolerance by adding height and also compensate the maximum stack tolerance by getting deformed in the mold tool. The flexible members may be made of any electrically conductive material capable of applying a bias force on compression.

Semiconductor packages and power modules as described herein may be utilized in high heat and high power environments such as automobiles, computers digital electronic circuitry, computer hardware, firmware, software, or in various combinations thereof. Portions of methods also may be performed by, and an apparatus may be implemented as, special purpose logic circuitry, e.g., an FPGA (field programmable gate array) or an ASIC (application-specific integrated circuit).

Some implementations may be implemented using various semiconductor processing and/or packaging techniques. Some implementations may be implemented using various types of semiconductor processing techniques associated with many different semiconductor substrates including, but not limited to, for example, Silicon (Si), Galium Arsenide (GaAs), Galium Nitride (GaN), silicon on insulator (SOI), and other substrate types.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a first substrate;
a second substrate;
a first die directly coupled to the first substrate and coupled between the first substrate and the second substrate;
a second die directly coupled to the second substrate and coupled between the first substrate and the second substrate;
an electrical spacer coupled between the first die and the second substrate; and
one or more flexible electrical supports directly coupled to the first substrate and the second substrate;
wherein the electrical spacer is directly coupled to the second substrate.

2. The semiconductor package of claim 1, wherein each of the one or more flexible electrical supports are directly coupled to the first substrate and to the second substrate.

3. The semiconductor package of claim 1, wherein the semiconductor package is a power module.

4. The semiconductor package of claim 1, wherein the one or more flexible electrical supports comprise one of a spring or a sponge-like structure.

5. The semiconductor package of claim 1, wherein the one or more flexible electrical supports comprise a shape comprising one of a square, a rectangle, a closed hexagonal, an open rhomboid, a closed rhomboid, a circle, an oval, an ellipse, or any combination thereof.

6. The semiconductor package of claim 1, wherein:
the first substrate comprises a first dielectric layer coupled between a first metal layer and a second metal layer; and
the second substrate comprises a second dielectric layer coupled between a third metal layer and a fourth metal layer.

7. A semiconductor package comprising:
a first substrate;
a second substrate;
a first die coupled between the first substrate and the second substrate and directly to the first substrate;
a second die coupled between the first substrate and the second substrate and directly to the second substrate;
an electrical spacer coupled between the first die and the second substrate and coupled directly to the second substrate; and
one or more flexible electrical supports directly coupled to the first substrate and the second substrate;
wherein the one or more flexible electrical supports are configured to bias the first substrate and the second substrate in a direction perpendicular to a surface of the first substrate directly coupled to the one or more flexible electrical supports when the one or more flexible electrical supports are compressed in a direction perpendicular to the surface of the first substrate directly coupled to the one or more flexible electrical supports.

8. The semiconductor package of claim 7, wherein each of the one or more flexible electrical supports are directly coupled to the first substrate and to the second substrate.

9. The semiconductor package of claim 7, wherein the semiconductor package is a power module.

10. The semiconductor package of claim 7, wherein the one or more flexible electrical supports comprise one of a spring or a sponge-like structure.

11. The semiconductor package of claim 7, wherein the one or more flexible electrical supports comprise a shape comprising one of a square, a rectangle, a closed hexagonal, an open rhomboid, a closed rhomboid, a circle, an oval, an ellipse, or any combination thereof.

12. A semiconductor package comprising:
a first substrate;
a second substrate;
a first die coupled between the first substrate and the second substrate and coupled directly to the first substrate;
an electrical spacer coupled between the second substrate and the first die;
a second die coupled between the first substrate and the second substrate and directly to the second substrate; and
one or more flexible electrical supports directly coupled to the first substrate and the second substrate;
wherein the electrical spacer is directly coupled to the second substrate and the first die.

13. The semiconductor package of claim 12, wherein each of the one or more flexible electrical supports are directly coupled to the first substrate and to the second substrate.

14. The semiconductor package of claim 12, wherein the semiconductor package is a power module.

15. The semiconductor package of claim 12, further comprising:
   a second spacer coupled between the first substrate and the second substrate.

16. The semiconductor package of claim 12, wherein the one or more flexible electrical supports comprise one of a spring or a sponge-like structure.

17. The semiconductor package of claim 12, wherein the one or more flexible electrical supports comprise a shape comprising one of a square, a rectangle, a closed hexagonal, an open rhomboid, a closed rhomboid, a circle, an oval, an ellipse, or any combination thereof.

18. The semiconductor package of claim 1, further comprising a second electrical spacer coupled between the first substrate and the second substrate, wherein the second electrical spacer is physically separate from the electrical spacer, wherein the electrical spacer is directly coupled to both the first die and the second substrate through a solder separate from the electrical spacer.

19. The semiconductor package of claim 7, wherein the electrical spacer is directly coupled to the second substrate through a solder separate from the electrical spacer, wherein the electrical spacer directly electrically couples the first die to only the second substrate.

20. The semiconductor package of claim 12, further comprising a second electrical spacer coupled between the first substrate and the second substrate, wherein the second electrical spacer is physically separate from the electrical spacer, wherein the electrical spacer is directly coupled to both the first die and the second substrate through a solder separate from the electrical spacer.

* * * * *